(12) United States Patent
Eberlein

(10) Patent No.: US 12,270,714 B2
(45) Date of Patent: Apr. 8, 2025

(54) CURRENT-MODE THERMAL SENSOR

(71) Applicant: Apple Inc., Cupertino, CA (US)

(72) Inventor: Matthias Eberlein, Holzkirchen (DE)

(73) Assignee: Apple Inc., Cupertino, CA (US)

( * ) Notice: Subject to any disclaimer, the term of this patent is extended or adjusted under 35 U.S.C. 154(b) by 454 days.

(21) Appl. No.: 17/657,057

(22) Filed: Mar. 29, 2022

(65) Prior Publication Data
US 2022/0316956 A1 Oct. 6, 2022

Related U.S. Application Data

(60) Provisional application No. 63/168,869, filed on Mar. 31, 2021.

(51) Int. Cl.
*G01K 7/00* (2006.01)
*G01K 7/01* (2006.01)
*G01R 19/10* (2006.01)
*G01R 19/165* (2006.01)

(52) U.S. Cl.
CPC ............... *G01K 7/00* (2013.01); *G01K 7/01* (2013.01); *G01R 19/10* (2013.01); *G01R 19/1659* (2013.01)

(58) Field of Classification Search
CPC ............ G01K 7/00; G01K 7/01; G01R 19/10; G01R 19/1659
See application file for complete search history.

(56) References Cited

U.S. PATENT DOCUMENTS

| | | | | |
|---|---|---|---|---|
| 5,198,700 | A * | 3/1993 | Whiteside | H03K 5/153 327/227 |
| 6,078,208 | A * | 6/2000 | Nolan | G01K 7/01 327/512 |
| 6,531,911 | B1 * | 3/2003 | Hsu | G05F 3/30 327/512 |
| 7,331,708 | B2 * | 2/2008 | Blom | G01K 7/01 374/171 |
| 8,262,286 | B2 * | 9/2012 | Peterson | G01K 7/01 327/512 |
| 8,354,875 | B2 * | 1/2013 | Zhang | G05F 3/30 327/512 |
| 8,665,130 | B2 * | 3/2014 | Makinwa | H03M 1/14 341/155 |
| 8,931,953 | B2 * | 1/2015 | Law | G06K 19/0717 374/100 |
| 9,748,969 | B1 * | 8/2017 | Bach | H03M 3/496 |
| 10,260,957 | B2 * | 4/2019 | Ma | G01K 3/04 |
| 2007/0098041 | A1 * | 5/2007 | Seo | G01K 7/00 374/170 |

(Continued)

*Primary Examiner* — Nathaniel T Woodward
*Assistant Examiner* — Philip L Cotey
(74) *Attorney, Agent, or Firm* — Kowert, Hood, Munyon, Rankin & Goetzel, P.C.; Dean M. Munyon

(57) ABSTRACT

A temperature sensor circuit is disclosed that uses multiple bipolar devices to generate a proportional to absolute temperature (PTAT) current and a complementary to absolute temperature (CTAT) current. A difference in the PTAT and CTAT current is evaluated using a feedback loop of an amplifier circuit which alternatively charges and discharges a capacitor to create a time-varying analog signal. A comparator circuit compares the analog signal to threshold values to generate an output digital signal whose duty cycle varies with temperature.

20 Claims, 8 Drawing Sheets

(56) References Cited

U.S. PATENT DOCUMENTS

| | | | |
|---|---|---|---|
| 2007/0195856 A1* | 8/2007 | Blom | G01K 7/01 374/E7.035 |
| 2008/0186001 A1* | 8/2008 | Singh | G01K 7/015 374/E7.035 |
| 2009/0146748 A1* | 6/2009 | Pernia | H03L 1/026 331/109 |
| 2013/0127353 A1* | 5/2013 | Athalye | H05B 45/35 315/193 |
| 2014/0269839 A1* | 9/2014 | Tai | G01K 7/34 374/184 |
| 2014/0333330 A1* | 11/2014 | Tai | G01R 27/2605 324/679 |
| 2016/0138978 A1* | 5/2016 | Eberlein | G01K 1/02 374/170 |
| 2016/0265983 A1* | 9/2016 | Hsu | G05F 3/225 |
| 2017/0016776 A1* | 1/2017 | Ma | H03K 17/687 |
| 2017/0288615 A1* | 10/2017 | Fronczak | H03F 3/45982 |
| 2019/0361477 A1* | 11/2019 | Acar | G05F 3/267 |
| 2019/0363682 A1* | 11/2019 | Michel | H03F 3/005 |
| 2020/0129770 A1* | 4/2020 | Opris | A61N 1/39622 |
| 2020/0201375 A1* | 6/2020 | Codega | G05F 3/30 |
| 2023/0074005 A1* | 3/2023 | Liu | G01K 7/16 |

\* cited by examiner

CURRENT-MODE THERMAL SENSOR

PRIORITY CLAIM

The present application claims priority to U.S. Provisional App. No. 63/168,869, entitled "Current-Mode Thermal Sensor," filed Mar. 31, 2021, the disclosure of which is incorporated by reference herein in its entirety.

TECHNICAL FIELD

This disclosure relates to sensor circuits in computer systems, and, more particularly, to temperature sensor circuit operation.

DESCRIPTION OF THE RELATED ART

Modern computer systems may perform certain tasks or operations in response to changes in the environment in which the computer systems are located. For example, changes in ambient light may result in a computer system adjusted brightness of a display. Additionally, changes in temperature may result in a computer system adjusting a level of processing being performed in order to maintain the computer system within designated thermal limits. In some cases, rapid changes in acceleration may result in the computer system taking certain actions to prevent damage to movable parts within the computer system.

To react to changes in environment, a computer system may include multiple sensor circuits designed to detect various effects or situations. For example, such sensor circuits may include temperature sensors, acceleration sensors, ambient light sensors, and the like. The outputs of such sensor circuits may be polled by a processor or controller included in the computer system to determine what actions to perform.

Sensor circuits, such as those described above, may include any suitable combination of logic circuits, analog circuits, radio frequency circuits, and the like. In some cases, the sensor circuits may employ passive sensing techniques. Other sensor circuits may employ active sensing by transmitting signals and monitoring any returning signals.

DETAILED DESCRIPTION OF EMBODIMENTS

In many computer systems, sensor circuits are used to measure operating characteristics, which may be used to adjust the operation of the computer systems. For example, in some cases, the temperature of a computer system is monitored in order to protect the computer system against overheating or other functional failures resulting from the temperature exceeding allowed limits.

Many temperature sensor circuits rely on PNP bipolar transistors in combination with power supply regulator circuits, bandgap reference circuits, buffer circuits, biasing circuits, sigma-delta analog-to-digital conversion (ADC) circuits, and extensive logic circuits. In some cases, the temperature sensor circuits also include charge-pump circuits and voltage-to-frequency converter circuits.

Some sensor circuits, such as those described above, can consume a large area on an integrated circuit, making integration difficult. Moreover, the accuracy of such sensor circuits is limited due to sensitivities to multiple sources of variation, such as power supply voltage variation, device variation, and the like. To compensate for device variation, some sensor circuits are trimmed a second time after manufacture trimming in order to achieve desired levels of accuracy.

Techniques described in the present disclosure allow for the direct processing of a current proportional to absolute temperature (PTAT) in conjunction with a current complementary to absolute temperature (CTAT) using an analog feedback loop that evaluates a difference between the two currents to generate a signal whose duty cycle encodes the temperature. By processing the two currents in such a fashion, the need for an analog-to-digital conversion circuit and a bandgap reference circuit may be eliminated, reducing circuit area and the need for additional trimming.

Figure 1:
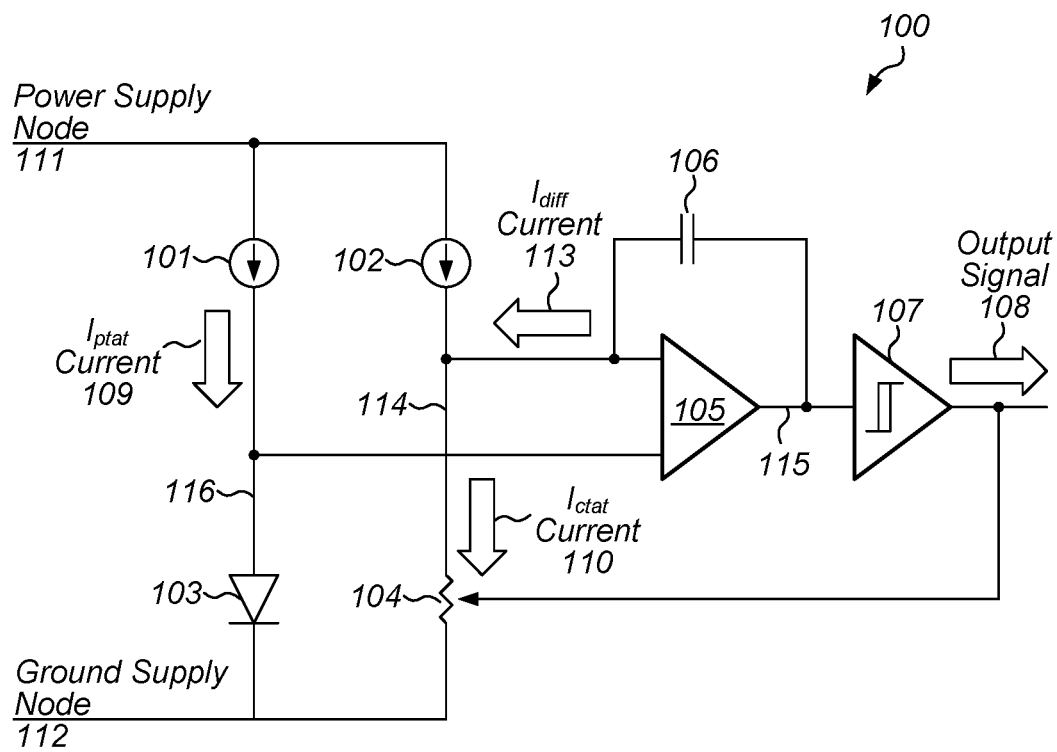
FIG. 1 is a block diagram of an embodiment of a temperature sensor circuit for a computer system.

Turning to FIG. 1, a block diagram of a sensor circuit is depicted. As illustrated, sensor circuit 100 includes current sources 101 and 102, diode 103, resistor 104, amplifier circuit 105, and Schmitt trigger circuit 107.

Current source 101 is coupled between power supply node 111 and node 116, and is configured to generate $I_{ptat}$ current 109. As described below, current source 101 may be implemented using any suitable combination of current mirrors, bipolar devices, and the like.

Diode 103 is coupled between node 116 and ground supply node 112. In various embodiments, as $I_{ptat}$ current 109 flows through diode 103 into ground supply node 112, a voltage drop is developed across diode 103, setting a voltage level on node 116. In various embodiments, diode 103 may be implemented as a bipolar transistor, and the voltage drop across diode 103 may correspond to a base-to-emitter voltage ($V_{BE}$) of the bipolar transistor.

Current source 102 is coupled between power supply node 111 and node 114. In various embodiments, current source 102 is configured to source $I_{ptat}$ current 109 to node 114. In some embodiments, current source 102 may be implemented using a current mirror that is configured to mirror the current generated by current source 101.

$I_{ctat}$ current 110 flows through resistor 104, which is coupled between node 114 and ground supply node 112. $I_{ptat}$ current 109 and $I_{ctat}$ current 110 are combined at node 114. In various embodiments, the currents are compared to each other via subtraction, resulting in a difference current (i.e., $I_{diff}$ current 113) flowing into or out of capacitor 106.

The value of resistor 104 is a function of output signal 108. In some embodiments, resistor 104 may include multiple resistors and switches that are configured to open and close based on the voltage level of output signal 108. By adjusting the value of resistor 104, the polarity of $I_{diff}$ current 113 can be changed from positive to negative so that capacitor 106 is either charged or discharged. In various embodiments, resistor 104 may be implemented using polysilicon, metal, or any other suitable material available as part of a semiconductor manufacturing process.

Amplifier circuit 105 is configured to generate a voltage level on node 115 using the voltage levels on nodes 116 and 114. Capacitor 106 is coupled between node 115 and node 114, and, in conjunction with amplifier circuit 105, integrates $I_{diff}$ current 113 to generate a voltage on node 115. In various embodiments, amplifier circuit 105 may be implemented using any suitable combination of metal-oxide semiconductor field-effect transistors (MOSFETs), Fin field-effect transistors (FinFETs), gate-all-around field-effect transistors (GAAFETs), or other suitable transconductance devices. Capacitor 106 may be implemented using a metal-oxide-metal (MOM), metal-insulator-metal (MIM), or any other suitable capacitor structure available as part of a semiconductor manufacturing process.

Schmitt trigger circuit 107 is configured to generate output signal 108 using the voltage on node 115. In various embodiments, Schmitt trigger circuit 107 is configured to compare the voltage on node 115 to a high-threshold value and a low-threshold value. In response to a determination that the voltage on node 115 is below the low-threshold value, Schmitt trigger circuit 107 may set output signal 108 to a voltage level at or near ground potential. In response to a determination that the voltage on node 115 is greater than the high-threshold value, Schmitt trigger circuit 107 may set output signal 108 to a voltage level at or near that of power supply node 111.

Figure 2:
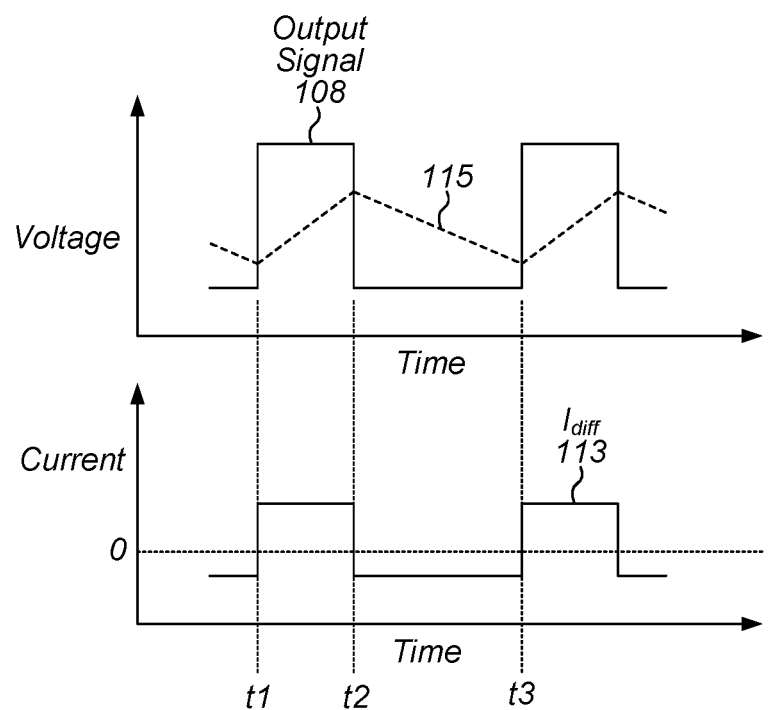
FIG. 2 illustrates example waveforms associated with the operation of a sensor circuit.

Example waveforms associated with the operation of a sensor circuit are depicted in FIG. 2. In various embodiments, the waveforms illustrated in FIG. 2 may be associated with the operation of sensor circuit 100. The top graph depicts the respective voltage levels of output signal 108 and node 115 as a function of time. The bottom graph depicts $I_{diff}$ current 113 as a function of time.

At time t1, output signal 108 transitions from ground to the voltage level of power supply node 111 in response to a voltage level of node 115 dropping below a low-threshold value. As described above, the low-threshold value against which the voltage level of node 115 is compared may be determined by Schmitt trigger circuit 107.

The change in the value of output signal 108 results in a change in a value of resistor 104. In various embodiments, the value of resistor 104 may toggle between two different values depending on the value of output signal 108. By changing the value of resistor 104, $I_{diff}$ current 113 toggles between two different values. In various embodiments, the two different values of $I_{diff}$ current 113 may flow in different directions, represented by having the two different values having different signs. As illustrated, the $I_{diff}$ current 113 transitions from a negative value to a positive value at time t1, which charges capacitor 106, thereby increasing the voltage level of node 115.

At time t2, output signal 108 transitions from the voltage level of power supply node 111 to ground potential in response to the voltage of node 115 exceeding a high-threshold level. As noted above, the high-threshold value may be determined by Schmitt trigger circuit 107.

The change in output signal 108 results in another change in the value of resistor 104. In this case, the change in the value of resistor 104 causes $I_{diff}$ current 113 to transition from a positive value to a negative value, which discharges capacitor 106. As capacitor 106 is discharged, the voltage level of node 115 decreases.

At time t3, the voltage level of node 115 again drops below the low-threshold value, which results in output signal 108 changing value as described above. The process then repeats as long as sensor circuit 100 is active. As described below, the duty cycle of output signal 108 can be used to determine a value of the temperature of sensor circuit 100.

Figure 3:
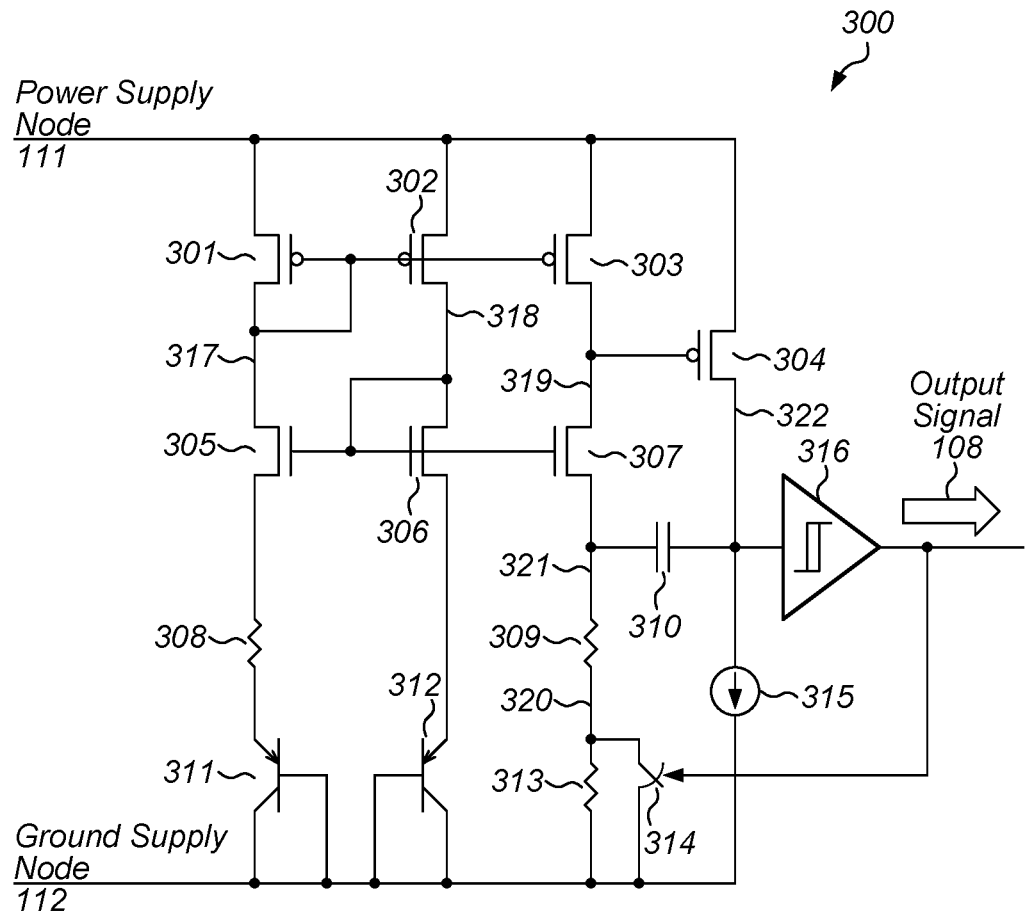
FIG. 3 is a block diagram of a different embodiment of a temperature sensor circuit.

Sensor circuits, such as sensor circuit 100, may be fabricated using various semiconductor manufacturing processes. Depending on the type of devices available in a given semiconductor manufacturing process, a sensor circuit may be implemented using various circuit topologies. One particular circuit topology for a sensor circuit is depicted in FIG. 3. As illustrated, sensor circuit 300 includes devices 301-307, resistors 308, 309 and 313, capacitor 310, devices 311 and 312, switch 314, current source 315 and Schmitt trigger circuit 316.

Device 301 is coupled between power supply node 111 and node 317, and is controlled by a voltage level on node 317. In a similar fashion, device 302 is coupled between power supply node 111 and node 318, and is controlled by the voltage level on node 317. In various embodiments, devices 301 and 302 form a current mirror circuit in which a current flowing through device 301 is replicated or "mirrored" in device 302.

Device 305 is coupled between node 317 and resistor 308, and is controlled by a voltage level on node 318. In a similar fashion, device 306 is coupled between node 318 and device 312, and is controlled by the voltage level on node 318. In various embodiments, devices 305 and 306 form a current mirror circuit in which a current flowing through device 306 is mirrored in device 305.

Resistor 308 is coupled between device 305 and device 311, which is, in turn coupled to ground supply node 112. A control terminal of device 311 is also coupled to ground supply node 112. In a similar fashion, device 312 is coupled between device 306 and ground supply node 112, and a control terminal of device 312 is also coupled to ground supply node 112. In various embodiments, the current densities of devices 311 and 312 may be different. In some embodiments, devices 311 and 312 may be implemented as PNP bipolar transistors with different emitter areas. In some embodiments, the PNP bipolar transistors may be implemented as parasitic vertical bipolar transistors fabricated using a complementary metal-oxide semiconductor (CMOS) process.

Device 303 is coupled to power supply node 111 and node 319, and is controlled by the voltage level on node 317. In various embodiments, device 303 forms a current mirror circuit with device 301. Device 307 is coupled between node 319 and node 321, and is controlled by the voltage on node 318. In various embodiments, device 307 forms a current mirror circuit with device 306.

Resistor 309 is coupled between node 321 and node 320. Resistor 313 is coupled between node 320 and ground supply node 112. In various embodiments, resistors 309 and 313 may correspond to resistor 104 as depicted in the embodiment of FIG. 1. Switch 314 is coupled between node 320 and ground supply node 112, and is configured to selectively couple node 320 to ground supply node 112 using output signal 108. In various embodiments, switch 314 may be implemented as a pass gate or other switching circuit that includes multiple MOSFETs, FinFETs, GAAFETs, or other suitable switching devices.

Device 304 is coupled between power supply node 111 and node 322, and is controlled by a voltage level on node 319. Capacitor 310 is coupled between node 321 and node 322. Capacitor 310 is part of a feedback loop for an amplifier that includes device 304. The addition of capacitor 310 in the feedback loop can help stabilize the amplifier. In various embodiments, capacitor 310 may be implemented as a MOM, MIM, or any other suitable capacitor structure.

Current source 315 is configured to sink a bias current from node 322. In various embodiments, current source 315 may be implemented as one or more MOSFETs, FinFETs, GAAFETs, or other suitable transconductance devices where a gate or control terminal is set to a particular voltage level to determine a value of the bias current.

Schmitt trigger circuit 316 is configured to generate output signal 108 using a voltage level of node 322. To generate output signal 108, Schmitt trigger circuit 316 may be further configured to convert an analog voltage level on node 322 to a digital signal. In various embodiments, Schmitt trigger circuit 316 may be implemented as a comparator circuit with hysteresis that applies positive feedback to a non-inverting input of the comparator circuit.

During operation, devices 311 and 312, in conjunction with devices 301, 302, 305 and 306, form a PTAT biasing loop that results in a PTAT current flowing in devices 301, 302, 305, and 306. The base-to-emitter voltage of device 312 is a CTAT voltage. In various embodiments, device 307 is a replica of device 306. As used herein, a replica device is a different instance of another device, and is designed and fabricated to have similar electrical characteristics. Since device 307 is a replica of device 306, the CTAT base-to-emitter voltage of device 312 is transformed into a CTAT current flowing through resistors 309 and 313.

The PTAT current and the CTAT current are combined at node 321. In various embodiments, the currents are compared to each other via subtraction, resulting in a difference current (e.g., $I_{diff}$ current 113) flowing into or out of capacitor 310. The direction of the difference current is based on the values of resistors 309 and 313, as well as the temperature of sensor circuit 300.

Depending on the direction of the difference current, capacitor 310 is linearly charged or discharged. As capacitor 310 is charged and discharged, the voltage level of node 322 increases or decreases in a linear fashion. Schmitt trigger circuit 316 converts the analog voltage level of node 322 to a digital value on output signal 108, which, in turn, controls switch 314. By opening and closing switch 314 in such a fashion, the effective resistance between node 321 and ground supply node 112 toggles between two values (the value of resistor 309 and a combined value of resistors 309 and 313). The change in effective resistance between node 321 and ground supply node 112 changes the direction of the difference current, resulting in the duty cycle of output signal 108 being modulated by the PTAT and CTAT currents to encode the temperature.

In various embodiments, devices 301-304 may be implemented as p-channel MOSFETs, FinFETs, GAAFETs, or any other suitable transconductance devices. Devices 305-307 may be implemented as n-channel MOSFETs, FinFETs, GAAFETs, or any other suitable transconductance devices. Resistors 308, 309, and 313 may be implemented using polysilicon, metal, or any other material available as part of a semiconductor manufacturing process.

As described above, the duty cycle of output signal 108 can be used to determine the temperature value. As noted above, $I_{diff}$ current 113 is the difference between the PTAT and CTAT currents. Substituting values in for $I_{ctat}$ and $I_{ptat}$, $I_{diff}$ can be expressed as shown in Equation 1, where $R_c$ is the effective CTAT resistance (either resistor 309, or the sum of resistors 309 and 313), $V_{be2}$ is the base-to-emitter voltage of device 312, $V_t$ is the thermal voltage of a PN junction, $R_p$ is the value of resistor 308, and N is the ratio of emitter areas between devices 311 and 312. In various embodiments, the emitter area of device 311 may be greater than the emitter area of device 312.

$$I_{diff} = I_{ctat} - I_{ptat} = \frac{V_{be2}}{R_c} - \frac{V_t}{R_p}\ln(N) \qquad (1)$$

The time for the voltage level on node 115 to transition up or down is given by Equation 2, where ΔU is an amount of hysteresis, and $C_1$ is the value of capacitor 310.

$$\Delta t = \frac{\Delta U \cdot C_1}{I_{diff}} \qquad (2)$$

The duty cycle, denoted DC, of output signal 108 can then be defined in terms of the transition time as shown in Equation 3, where $\Delta t_1$ is the transition time for the voltage of node 115 where the CTAT resistance is the value of resistor 309, and where $\Delta t_2$ is the transition time for the voltage of node 115 where the CTAT resistance is the sum of the respective values of resistors 309 and 313.

$$DC = \frac{\Delta t_1}{\Delta t_1 + \Delta t_2} = \frac{|I_{diff2}|}{|I_{diff1}| + |I_{diff2}|} \qquad (3)$$

Combining Equations 1 and 3, the duty cycle can be expressed as shown in Equation 4, where $R_{c1}$ is the value of resistor 309 and $R_{c2}$ is the value of resistor 313.

$$DC = \frac{R_{c1}(R_{c1} + R_{c2})}{R_{c2}R_p} \cdot \frac{V_t \ln(N)}{V_{be2}} \qquad (4)$$

From Equation 4, it is evident that the duty cycle depends on the ratio of devices 311 and 312, the thermal voltage, and the base-to-emitter voltage of device 312. It is noted that $V_{be2}$ can be approximated as $V_{be2}$=VG0+tc·T, where VG0 is the silicon bandgap, tc is the temperature coefficient of device 312, and T is the temperature. Substituting the approximation for $V_{be2}$ into Equation 4, the temperature may be expressed as shown in Equation 5, where $k_b$ is Boltzmann's constant, and e is Euler's constant.

$$T[°K] = \frac{VGO}{\frac{x}{DC}\frac{k_b}{e}\ln(N) - tc}, \qquad (5)$$

where $$x = \frac{R_{c1}(R_{c1} + R_{c2})}{R_{c2}R_p}$$

As evident from Equation 2, output signal 108 does not depend on upper or lower threshold values of the voltage of node 115. The hysteresis ΔU, therefore, affects only the frequency of the signal on node 115, and can be implemented using a Schmitt trigger circuit (e.g., Schmitt trigger circuit 316). It is further noted that the impact of capacitor 310 similarly affects only the frequency of the signal on node 115.

Figure 4:
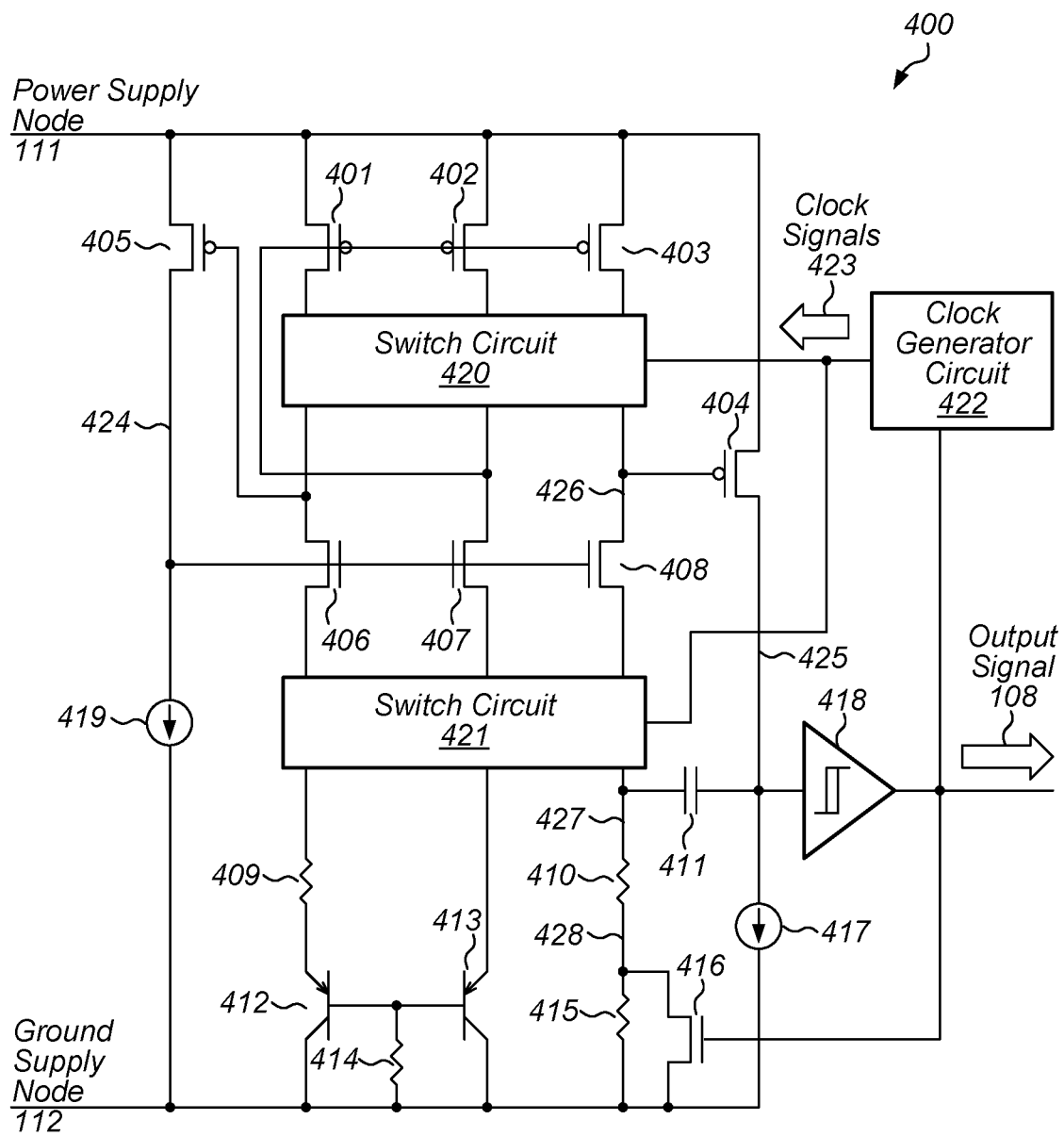
FIG. 4 is a block diagram of another embodiment of a temperature sensor circuit.

Turning to FIG. 4, another embodiment of a sensor circuit is depicted. As illustrated, sensor circuit 400 includes devices 401-408, 412, 413, and 416, resistors 409, 410, 414, and 415, capacitor 411, current sources 417 and 419, Schmitt trigger circuit 418, switch circuits 420 and 421, and clock generator circuit 422.

As noted above, some of the devices in the embodiments of both FIGS. 3 and 4 are intended to be replicas of each other. During manufacturing, however, some differences between the devices are possible. One possible technique used to compensate for such variation is to employ dynamic element matching (DEM).

Devices 401-403 function in a similar fashion to devices 301-303 as depicted in the embodiment of FIG. 3. In various embodiments, devices 401-403 may be implemented as p-channel MOSFETs, FinFETs, GAAFETs, or any other suitable transconductance devices.

Devices 406-408 function in a similar fashion to devices 305-307 as depicted in the embodiment of FIG. 3. In various embodiments, devices 406-408 may be implemented as n-channel MOSFETs, FinFETs, GAAFETs, or any other suitable transconductance devices.

Device 405 is coupled between power supply node 111 and node 424, and a control terminal of device 405 is coupled to device 406. Current source 419 is coupled between node 424 and ground supply node 112. Device 405 and current source 419 form a bias network for devices 406-408 that provides symmetric DC levels for the drain voltages of devices 401-403 and 406-408. In various embodiments, device 405 may be implemented as a p-channel MOSFET, FinFET, GAAFET, or any other suitable transconductance device, and current source 419 may be implemented as a biased device that is part of a current mirror or other suitable circuit.

Device 412 is coupled between resistor 409 and ground supply node 112, while device 413 is coupled between switch circuit 421 and ground supply node 112. Resistor 409 is further coupled to switch circuit 421. Respective control terminals of devices 412 and 413 are coupled to resistor 414, which is, in turn, coupled to ground supply node 112. In various embodiments, resistor 409 may be implemented using polysilicon, metal, or any other material available as part of a semiconductor manufacturing process.

In various embodiments, the current densities of devices 412 and 413 may be different. In some embodiments, devices 412 and 413 may be implemented as PNP bipolar transistors with different emitter areas. In some cases, the PNP bipolar transistors may be implemented as parasitic vertical bipolar transistors fabricated using a CMOS process. In various embodiments, devices 412 and 413 function in a similar fashion to devices 311 and 312, respectively, of the embodiment depicted in FIG. 3.

Switch circuit 420 is configured to sequentially swap the drain connections between devices 401-403 using clock signals 423. In a similar fashion, switch circuit 421 is configured to sequentially swap the drain connections between device 406-408 using clock signals 423. By switching the drain connections of devices 401-403 and the drain connections of devices 406-408, the effect on output signal 108 from differences in the electrical characteristics of devices 401-403 and from differences in the electrical characteristics of devices 406-408 can be reduced by averaging the duty cycle of output signal 108 over multiple cycles. In various embodiments, switch circuits 420 and 421 may be implemented using multiple pass gate circuits arranged in a wired-OR fashion or any other suitable circuit topology.

Clock generator circuit 422 is configured to generate clock signals 423 using output signal 108. In various embodiments, clock generator circuit 422 may be configured to change respective values of clock signals 423 on each rising (or falling) edge of output signal 108. Clock generator circuit 422 may, in some embodiments, be implemented as a shift register or other suitable sequential logic circuit.

Schmitt trigger circuit 418 is configured to generate output signal 108 using a voltage level of node 425. To generate output signal 108, Schmitt trigger circuit 418 may be further configured to convert an analog voltage level on node 425 to a digital signal. In various embodiments, Schmitt trigger circuit 418 may be implemented as a comparator circuit with hysteresis that applies positive feedback to a non-inverting input of the comparator circuit.

Device 404 is coupled between power supply node 111 and node 425, and is controlled by a voltage level on node 426. Capacitor 411 is coupled between node 427 and node 425. Capacitor 411 is part of a feedback loop for an amplifier that includes device 404. The addition of capacitor 411 in the feedback loop can help stabilize the amplifier. In various embodiments, capacitor 411 may be implemented as a MOM, MIM, or any other suitable capacitor structure.

Resistor 410 is coupled between node 427 and node 428. Resistor 415 is coupled between node 428 and ground supply node 112. In various embodiments, resistors 410 and 415 may correspond to resistor 104 as depicted in the embodiment of FIG. 1. Device 416 is coupled between node 428 and ground supply node 112, and is configured to selectively couple node 428 to ground supply node 112 using output signal 108. In various embodiments, device 416 may be implemented as an n-channel MOSFET, FinFET, GAAFET, or other suitable switching device, and resistors 410 and 415 may be implemented using polysilicon, metal, or any other material available as part of a semiconductor manufacturing process.

Current source 417 is configured to sink a bias current from node 425. In various embodiments, current source 417 may be implemented as one or more MOSFETs, FinFETs, GAAFETs, or other suitable transconductance devices where a gate or control terminal is set to a particular voltage level to determine a value of the bias current.

During operation, devices 412 and 413, in conjunction with devices 401, 402, 406 and 407, form a PTAT biasing loop that results in a PTAT current flowing in devices 401, 402, 406, and 407. The base-to-emitter voltage of device 413 is a CTAT voltage. In various embodiments, device 408 is a replica of device 407 and, as such, the CTAT base-to-emitter voltage of device 413 is transformed into a CTAT current flowing through resistors 410 and 415.

The PTAT current and the CTAT current are combined at node 427. In various embodiments, the currents are compared to each other via subtraction, resulting in a difference current (e.g., $I_{diff}$ current 113) flowing into or out of capacitor 411. The direction of the difference current is based on the values of resistors 410 and 415, as well as the temperature of sensor circuit 400.

Depending on the direction of the difference current, capacitor 411 is linearly charged or discharged. As capacitor 411 is charged and discharged, the voltage level of node 425 increases or decreases in a linear fashion. Schmitt trigger circuit 418 converts the analog voltage level of node 425 to a digital value on output signal 108, which, in turn, controls device 416. By activating and deactivating device 416 in such a fashion, the effective resistance between node 427 and ground supply node 112 toggles between two values (the value of resistor 410 and a combined value of resistors 410 and 415). The change in effective resistance between node 427 and ground supply node 112, changes the direction of the difference current, resulting in the duty cycle of output signal 108 being modulated by the PTAT and CTAT currents to encode the temperature in the duty cycle of signal 108.

To summarize, various embodiments of a temperature sensor circuit are disclosed. Broadly speaking, an apparatus is contemplated in which a first current source is configured to generate a first current whose value is proportional to temperature, and a second current source is configured to generate a second current whose value is complementary to temperature. An amplifier circuit is configured to generate an integrated signal using a difference between the first current and the second current, and a comparator circuit is configured to generate, using the integrated signal, an output signal whose duty cycle is based on the difference between the first current and the second current.

In some embodiments, the apparatus further includes a first bipolar device and a second bipolar device coupled to the first bipolar device, where a first emitter area of the first bipolar device is greater than a second emitter area of the second bipolar device. The first bipolar device and the second bipolar device are configured to provide bias to the first current source, and the second current source is further configured to generate the second current using a base-to-emitter voltage of the second bipolar device.

In other embodiments, the apparatus further comprises a capacitor coupled between an output of the amplifier circuit and an input of the amplifier circuit. To generate the integrated signal, the amplifier circuit is further configured to charge the capacitor during a first time period using the difference current, and discharge the capacitor during a second time period using the difference current.

In another embodiment, to generate the output signal, the comparator circuit is further configured to compare the integrated signal to an upper threshold and a lower threshold. In various embodiments, the apparatus further comprises a variable resistor coupled to the input of the amplifier circuit, and where a value of the variable resistor is based on the output signal. In some cases, the variable resistor includes a first resistor and a second resistor coupled in series, and a switch configured to couple a node between the first resistor and the second resistor using the output signal.

Figure 5:
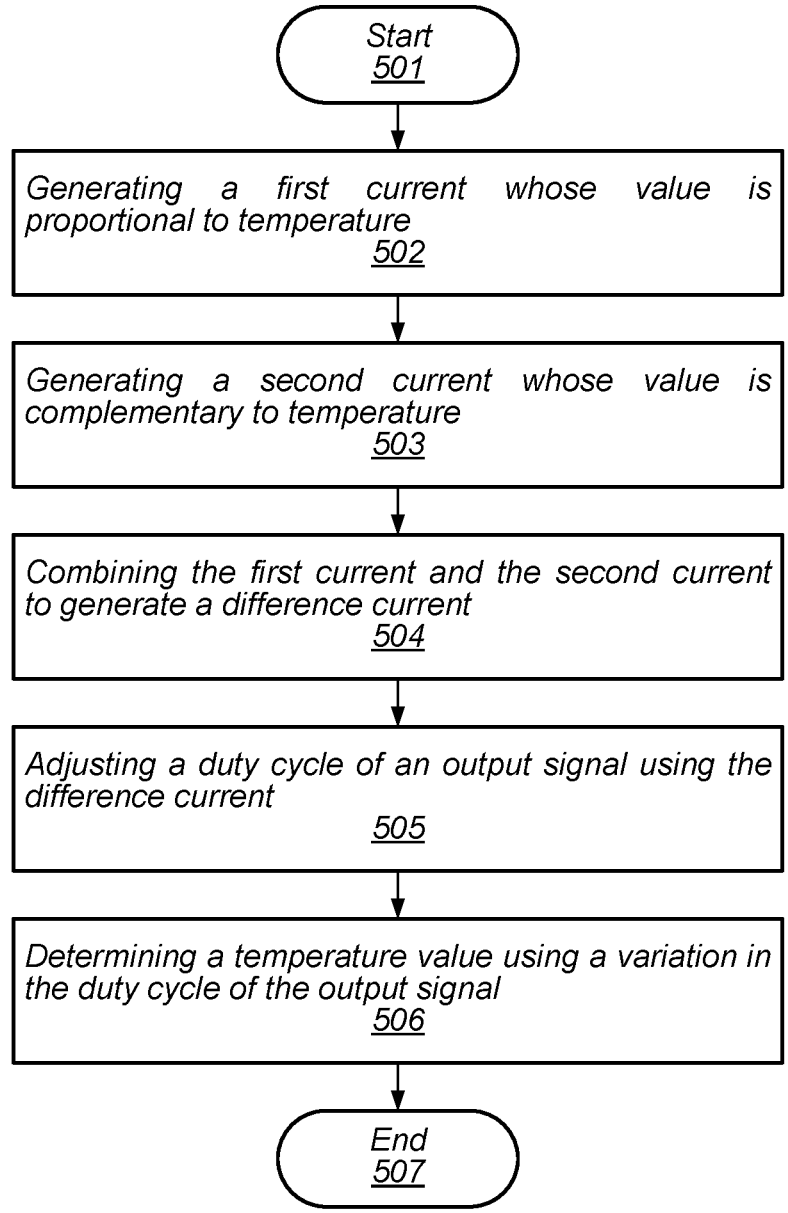
FIG. 5 illustrates a flow diagram depicting an embodiment of a method for operating a temperature sensor circuit.

Turning to FIG. 5, a flow diagram depicting an embodiment of a method for operating a sensor circuit is illustrated. The method, which may be applied to various sensor circuits, such as temperature sensor circuit 100, begins in block 501.

The method includes generating a first current whose value is proportional to temperature (block 502). In various embodiments, the method further includes generating the first current using a first bipolar device and a second bipolar device. In some embodiments, a first emitter area of the first bipolar device is greater than a second emitter area of the second bipolar device. As described above, the first bipolar device and the second bipolar device may be included as part of a bias circuit configured to provide a bias voltage and/or current to one or more current mirror circuits.

The method also includes generating a second current whose value is complementary to temperature (block 503). In some embodiments, the method further includes generating the second current using a base-to-emitter voltage of the second bipolar device. In various embodiments, generating the second current includes converting the base-to-emitter voltage to a current using a current mirror circuit or other suitable circuit.

The method further includes combining the first current and the second current to generate a difference current (block 504). In various embodiments, combining the first current and the second current includes subtracting the second current from the first current. In some embodiments, the first current and the second current are combined on an input node of an amplifier circuit.

The method also includes adjusting a duty cycle of an output signal using the difference current (block 505). In various embodiments, adjusting the duty cycle of the output signal may include charging, during a first time period and using the difference current, a capacitor in the feedback loop of the amplifier circuit, discharging, during a second time period and using the difference current, the capacitor, and generating an integrated signal using an output voltage of the amplifier circuit. In some cases, the method may further include comparing the integrated signal to an upper threshold and a lower threshold to generate the output signal.

In some embodiments, adjusting the duty cycle of the output signal may include changing, using the output signal, a value of a variable resistor coupled to an input of the amplifier circuit. In various embodiments, the variable resistor may include a first resistor and a second resistor coupled in series, and wherein changing the value of the variable resistor includes coupling, using the output signal, a node between the first resistor and the second resistor to a ground supply node.

The method further includes determining a temperature value using a variation in the duty cycle of the output signal (block 506). In various embodiments, determining the temperature value may include incrementing a counter circuit using the output signal, and comparing a value of the counter circuit accumulated over a particular period of time to a reference count value. The method concludes in block 507.

Figure 6:
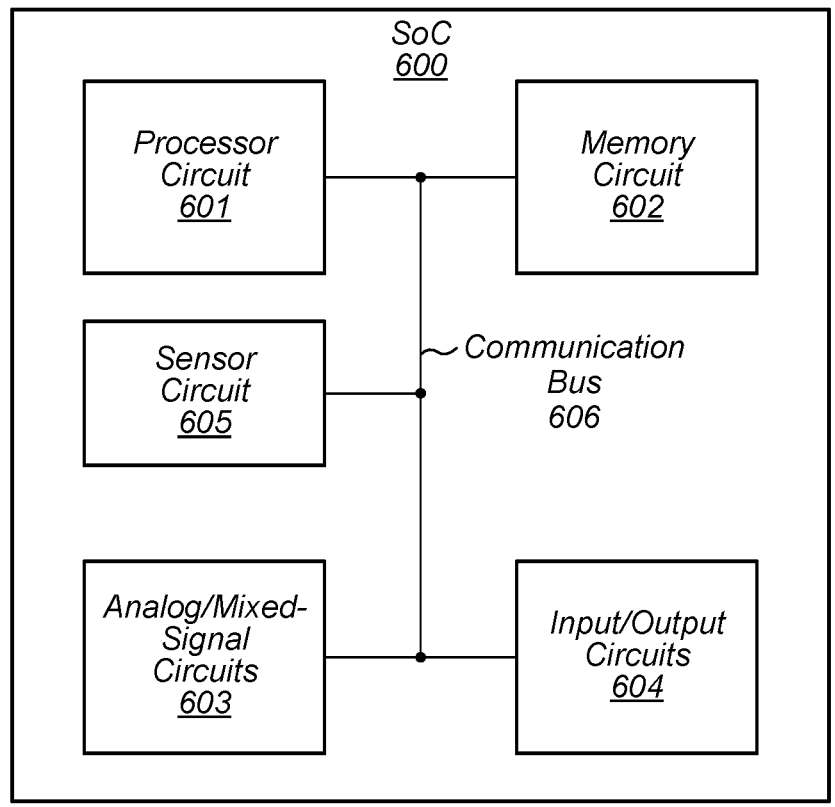
FIG. 6 is a block diagram of an embodiment of a system-on-a-chip.

A block diagram of an embodiment of a system-on-a-chip (SoC) is illustrated in FIG. 6. As illustrated, SoC 600 includes processor circuit 601, memory circuit 602, analog/mixed-signal circuits 603, input/output circuits 604, and sensor circuit 605 each of which is coupled to communication bus 606. It is noted that in various embodiments, sensor circuit 605 may correspond to any of the sensor circuits described above. In various embodiments, SoC 600 may be configured for use in a desktop computer, server, or in a mobile computing application such as, a tablet, laptop computer, or wearable computing device.

Processor circuit 601 may, in various embodiments, be representative of a general-purpose processor that performs computational operations. For example, processor circuit 601 may be a central processing unit (CPU), a graphics processing unit (GPU), a microcontroller, or the like, and may be implemented as an application-specific integrated circuit (ASIC), a field-programmable gate array (FPGA), etc. In some embodiments, processor circuit 601 may interface to memory circuit 602, analog/mixed-signal circuits 603, input/output circuits 604, and sensor circuit 605 via communication bus 606. In various embodiments, processor circuit 601 may be configured to extract a temperature value using a duty cycle of a signal generated by sensor circuit 605. In some cases, processor circuit 601 may employ a counter circuit that is incremented by the signal generated by sensor circuit 605. In such cases, processor circuit 601 may be further configured to compare a count value of the counter circuit accumulated over a particular time period to a reference count value to extract the temperature value.

Memory circuit 602 may, in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 6, a single memory circuit is depicted. In other embodiments, any suitable number of memory circuits may be employed.

Analog/mixed-signal circuits 603 may include a crystal oscillator circuit, an analog-to-digital converter (ADC) circuit, a digital-to-analog converter (DAC) circuit, and a phase-locked loop circuit (all not shown). In other embodiments, analog/mixed-signal circuits 603 may be configured to perform power management tasks with the inclusion of on-chip power supplies and voltage regulators.

Input/output circuits 604 may be configured to coordinate data transfer between SoC 600 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 604 may be configured to implement a version of Universal Serial Bus (USB) protocol or IEEE 1394 (Firewire®) protocol.

Input/output circuits 604 may also be configured to coordinate data transfer between SoC 600 and one or more devices (e.g., other computing systems or integrated circuits) coupled to SoC 600 via a network. In one embodiment, input/output circuits 604 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 604 may be configured to implement multiple discrete network interface ports.

Sensor circuit 605 may, in various embodiments, correspond to any of the sensor circuits described above. For example, in some embodiments, sensor circuit 605 may be implemented using temperature sensor circuit 100. Although only one sensor circuit is depicted in the embodiment of FIG. 6, in other embodiments, any suitable number of sensor circuits may be employed.

Figure 7:
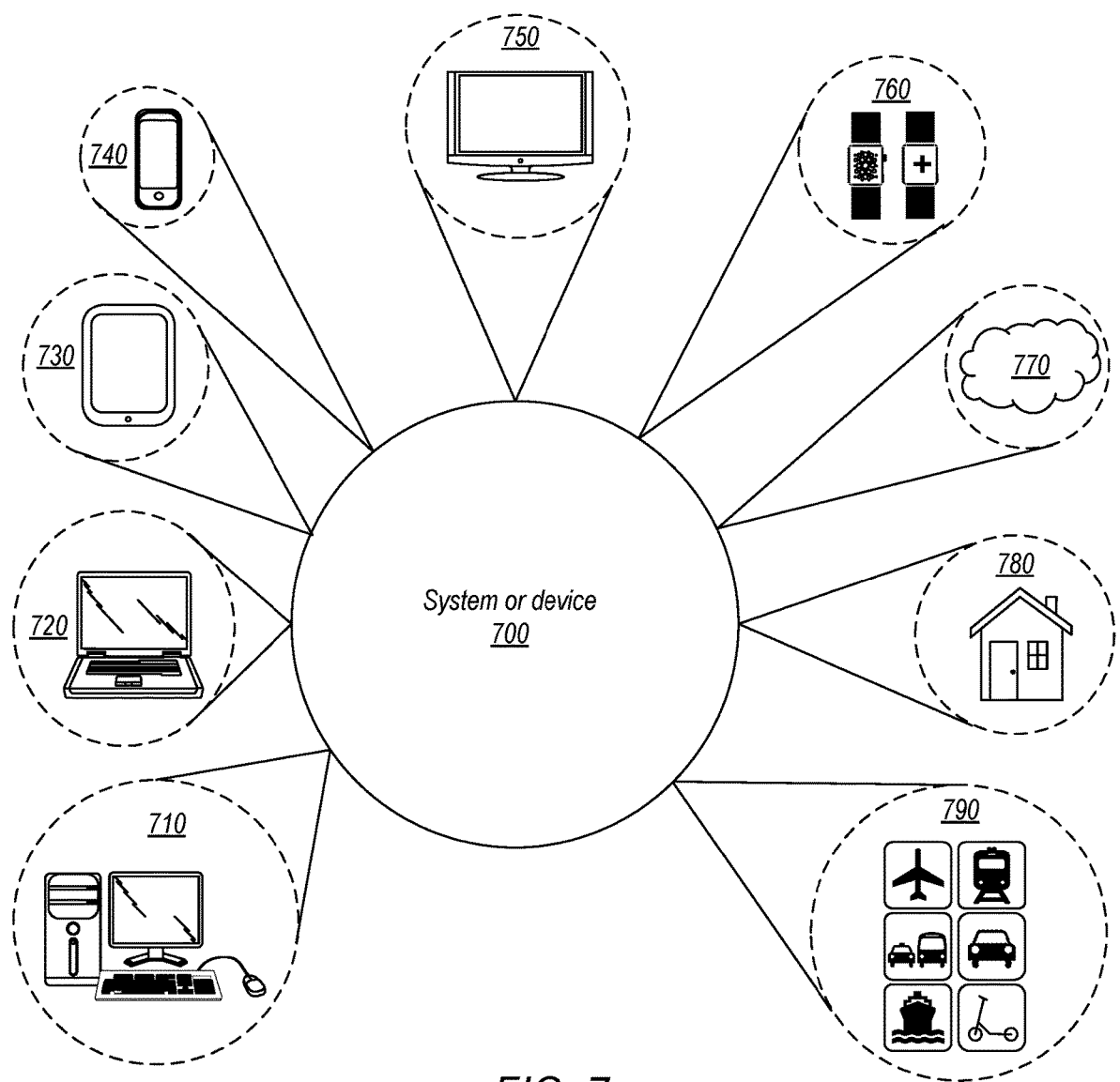
FIG. 7 is a block diagram of various embodiments of computer systems that may include temperature sensor circuits.

Turning now to FIG. 7, various types of systems that may include any of the circuits, devices, or systems discussed above are illustrated. System or device 700, which may incorporate or otherwise utilize one or more of the techniques described herein, may be utilized in a wide range of areas. For example, system or device 700 may be utilized as part of the hardware of systems such as a desktop computer 710, laptop computer 720, tablet computer 730, cellular or mobile phone 740, or television 750 (or set-top box coupled to a television).

Similarly, disclosed elements may be utilized in a wearable device 760, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 700 may also be used in various other contexts. For example, system or device 700 may be utilized in the context of a server computer system, such as a dedicated server or on shared hardware that implements a cloud-based service 770. Still further, system or device 700 may be implemented in a wide range of specialized everyday devices, including devices 780 commonly found in the home such as refrigerators, thermostats, security cameras, etc. The interconnection of such devices is often referred to as the "Internet of Things" (IoT). Elements may also be implemented in various modes of transportation. For example, system or device 700 could be employed in the control systems, guidance systems, entertainment systems, etc. of various types of vehicles 790.

The applications illustrated in FIG. 7 are merely exemplary and are not intended to limit the potential future applications of disclosed systems or devices. Other example applications include, without limitation: portable gaming devices, music players, data storage devices, unmanned aerial vehicles, etc.

Figure 8:
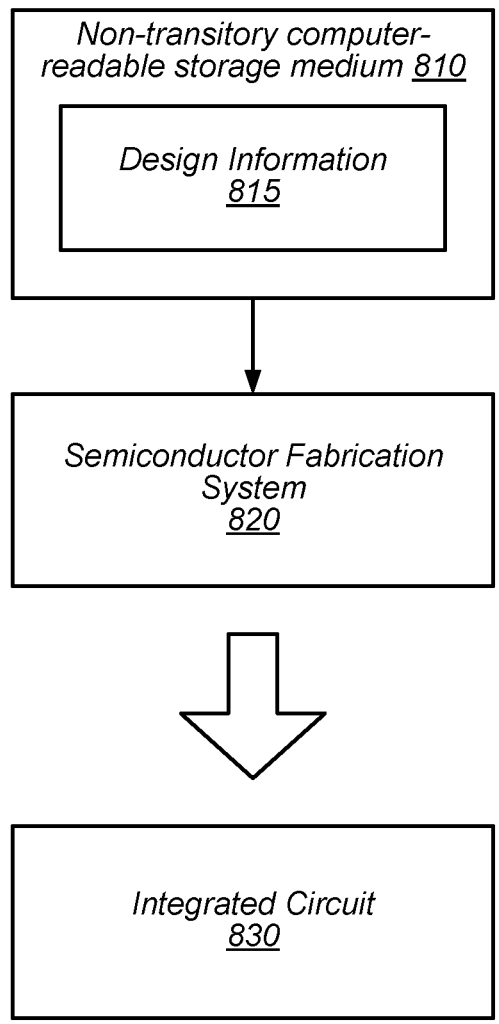
FIG. 8 illustrates an example of a non-transitory computer-readable storage medium that stores circuit design information.

FIG. 8 is a block diagram illustrating an example of a non-transitory computer-readable storage medium that stores circuit design information, according to some embodiments. In the illustrated embodiment, semiconductor fabrication system 820 is configured to process design information 815 stored on non-transitory computer-readable storage medium 810 and fabricate integrated circuit 830 based on design information 815.

Non-transitory computer-readable storage medium 810 may comprise any of various appropriate types of memory devices or storage devices. Non-transitory computer-readable storage medium 810 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 810 may include other types of non-transitory memory as well or combinations thereof. Non-transitory computer-readable storage medium 810 may include two or more memory mediums, which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system, such as semiconductor fabrication system 820, for example. In some embodiments, design information 815 may include a netlist that specifies elements of a cell library, as well as their connectivity. One or more cell libraries used during logic synthesis of circuits included in integrated circuit 830 may also be included in design information 815. Such cell libraries may include information indicative of device or transistor level netlists, mask design data, characterization data, and the like, of cells included in the cell library.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown or described herein. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of elements. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a first current source configured to generate a first current, a value of which is proportional to temperature;
   a second current source configured to generate a second current, a value of which is complementary to temperature;
   an amplifier circuit configured to generate an integrated signal, the integrated signal generated based on a difference current corresponding to a difference between the first current and the second current; and
   a comparator circuit configured to generate, based on the integrated signal, an output signal, wherein a duty cycle of the output signal is based on a direction of the difference current as the difference current passes through a capacitor coupled between an output of the amplifier circuit and an input of the amplifier circuit, and wherein a temperature is determinable based on the duty cycle.

2. The apparatus of claim 1, further comprising:
   a first bipolar device; and
   a second bipolar device coupled to the first bipolar device, wherein a first emitter area of the first bipolar device is greater than a second emitter area of the second bipolar device;
   wherein the first bipolar device and the second bipolar device are configured to provide bias to the first current source; and
   wherein the second current source is further configured to generate the second current using based on a base-to-emitter voltage of the second bipolar device.

3. The apparatus of claim 1, further comprising the capacitor, and wherein, to generate the integrated signal, the amplifier circuit is further configured to:
   charge the capacitor during a first time period and using the difference current; and
   discharge the capacitor during a second time period and using the difference current.

4. The apparatus of claim 3, wherein to generate the output signal, the comparator circuit is further configured to compare the integrated signal to an upper threshold and a lower threshold.

5. The apparatus of claim 1, wherein the comparator circuit includes a Schmitt trigger circuit.

6. The apparatus of claim 1, further comprising:
   a variable resistor coupled to the comparator circuit and configured to receive the output signal, wherein a resistive value of the variable resistor varies based on the output signal, and wherein the duty cycle is based on the resistive value.

7. A method, comprising:
   generating, by a first current source, a first current, a value of which is proportional to temperature;
   generating, by a second second current source, a second current, a value of which is complementary to temperature;
   combining, by an amplifier circuit, the first current and the second current to generate a difference current;
   adjusting a duty cycle of an output signal based on a direction of the difference current as the difference current passes through a capacitor coupled between an output of the amplifier circuit and an input of the amplifier circuit; and
   determining a temperature value based on a variation in the duty cycle of the output signal.

8. The method of claim 7, wherein combining the first current and the second current includes subtracting the second current from the first current.

9. The method of claim 7, further comprising:
   generating the first current using a first bipolar device and a second bipolar device, wherein a first emitter area of the first bipolar device is greater than a second emitter area of the second bipolar device; and
   generating the second current using a base-to-emitter voltage of the second bipolar device.

10. The method of claim 7, wherein adjusting the duty cycle of the output signal includes:
    charging, during a first time period and using the difference current, the capacitor;
    discharging, during a second time period and using the difference current, the capacitor; and
    generating an integrated signal using an output voltage of the amplifier circuit.

11. The method of claim 10, further comprising comparing the integrated signal to an upper threshold and a lower threshold to generate the output signal.

12. The method of claim 7, wherein adjusting the duty cycle of the output signal includes changing, using the output signal, a value of a variable resistor coupled to an input of the amplifier circuit.

13. The method of claim 12, wherein the variable resistor includes a first resistor and a second resistor coupled in series, and wherein changing the value of the variable resistor includes coupling, using the output signal, a node between the first resistor and the second resistor to a ground supply node.

14. An apparatus, comprising:
a sensor circuit configured to:
generate a first current, a value of which is proportional to temperature;
generate a second current, a value of which is complementary to temperature;
combine the first current and the second current to generate a difference current; and
adjust a duty cycle of an output signal based on a direction of the difference current as the difference current passes through a capacitor of the sensor circuit; and
a functional circuit configured to determine a temperature value based on a variation in the duty cycle of the output signal.

15. The apparatus of claim 14, wherein to combine the first current and the second current, the sensor circuit is further configured to subtract the second current from the first current.

16. The apparatus of claim 14, wherein the sensor circuit includes a first bipolar device and a second bipolar device, wherein a first emitter area of the first bipolar device is greater than a second emitter area of the second bipolar device, and wherein the sensor circuit is further configured to:
generate the first current using the first bipolar device and the second bipolar device; and
generate the second current using a base-to-emitter voltage of the second bipolar device.

17. The apparatus of claim 14, wherein the sensor circuit includes an amplifier circuit and the capacitor included in a feedback loop of the amplifier circuit, wherein the sensor circuit is further configured to:
charge, during a first time period and using the difference current, the capacitor;
discharge, during a second time period and using the difference current, the capacitor; and
generate an integrated signal using an output voltage of the amplifier circuit.

18. The apparatus of claim 17, wherein the sensor circuit is further configured to compare the integrated signal to an upper threshold and a lower threshold to generate the output signal.

19. The apparatus of claim 17, wherein the sensor circuit includes a variable resistor coupled to an input of the amplifier circuit, and wherein to adjust the duty cycle of the output signal, the sensor circuit is further configured to change a value of the variable resistor using the output signal.

20. The apparatus of claim 19, wherein the variable resistor includes a first resistor and a second resistor coupled in series, and wherein to change the value of the variable resistor, the sensor circuit is further configured to couple, using the output signal, a node between the first resistor and the second resistor to a ground supply node.

* * * * *